(12) United States Patent
Yamaguchi

(10) Patent No.: US 7,126,227 B2
(45) Date of Patent: Oct. 24, 2006

(54) WIRING SUBSTRATE, SEMICONDUCTOR DEVICE, SEMICONDUCTOR MODULE, ELECTRONIC EQUIPMENT, METHOD FOR DESIGNING WIRING SUBSTRATE, METHOD FOR MANUFACTURING SEMICONDUCTOR DEVICE, AND METHOD FOR MANUFACTURING SEMICONDUCTOR MODULE

(75) Inventor: Koji Yamaguchi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 22 days.

(21) Appl. No.: 10/753,357

(22) Filed: Jan. 9, 2004

(65) Prior Publication Data
US 2004/0183205 A1 Sep. 23, 2004

(30) Foreign Application Priority Data
Jan. 16, 2003 (JP) ............................. 2003-007769

(51) Int. Cl.
*H01L 23/48* (2006.01)
(52) U.S. Cl. .................. 257/778; 257/737; 257/E23.01
(58) Field of Classification Search ................ 257/778, 257/737, 738
See application file for complete search history.

(56) References Cited

U.S. PATENT DOCUMENTS

| | | | | |
|---|---|---|---|---|
| 4,599,634 A | * | 7/1986 | Culmer et al. | 257/254 |
| 6,587,353 B1 | * | 7/2003 | Sumikawa et al. | 361/760 |

FOREIGN PATENT DOCUMENTS

| | | | |
|---|---|---|---|
| JP | 08-055875 | | 2/1996 |
| JP | 09-298254 | | 11/1997 |
| JP | 10-256428 | | 9/1998 |
| JP | 2000-133668 | | 5/2000 |
| JP | 2000-243862 | | 9/2000 |
| JP | 2002-289645 | | 10/2002 |
| JP | 2004281470 A2 | * | 7/2004 |

* cited by examiner

*Primary Examiner*—Roy Potter
(74) *Attorney, Agent, or Firm*—Oliff & Berridge, PLC

(57) ABSTRACT

The invention can provide an improvement in the connection reliability in mounting semiconductor chips. The invention can include solder balls that are disposed on a back surface of an interposer substrate, in a manner to avoid diagonal lines of the interposer substrate, and a semiconductor chip is mounted on a surface of the interposer substrate. The invention permits electronic devices to be made that are smaller and lighter, while improving their reliability.

13 Claims, 13 Drawing Sheets

FIG. 12 (a) (PRIOR ART)
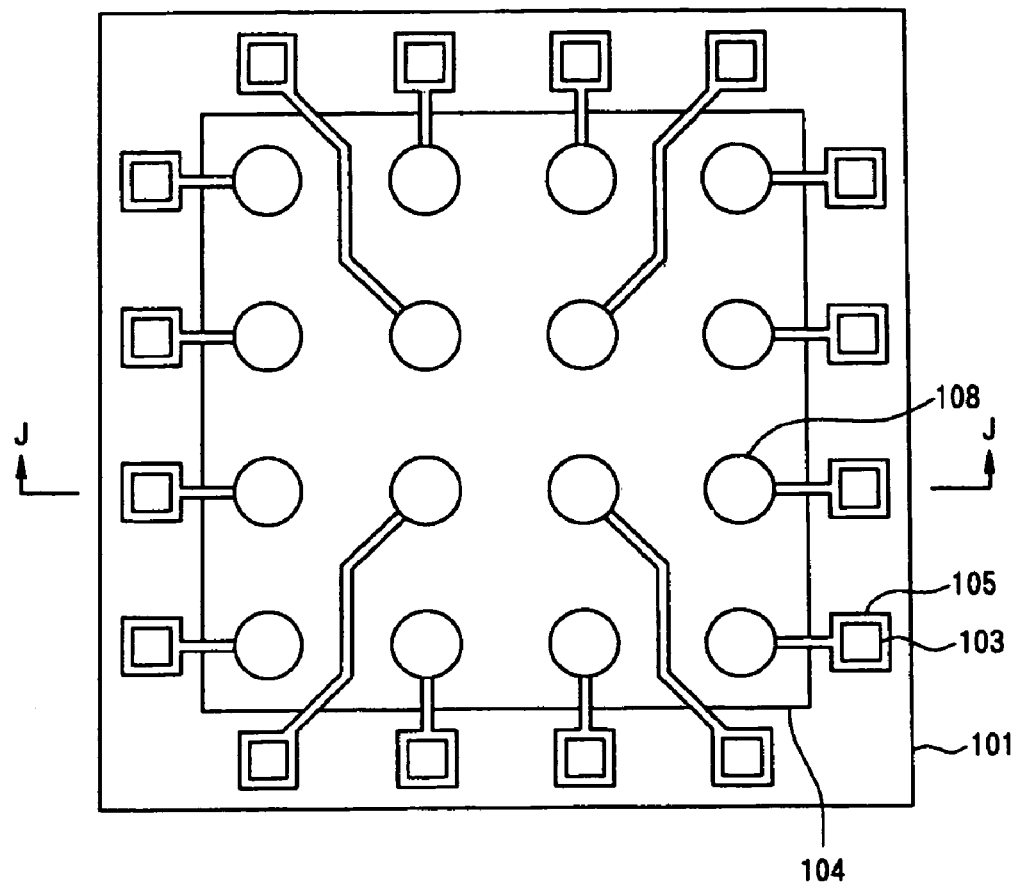
FIG. 12 (b) (PRIOR ART)
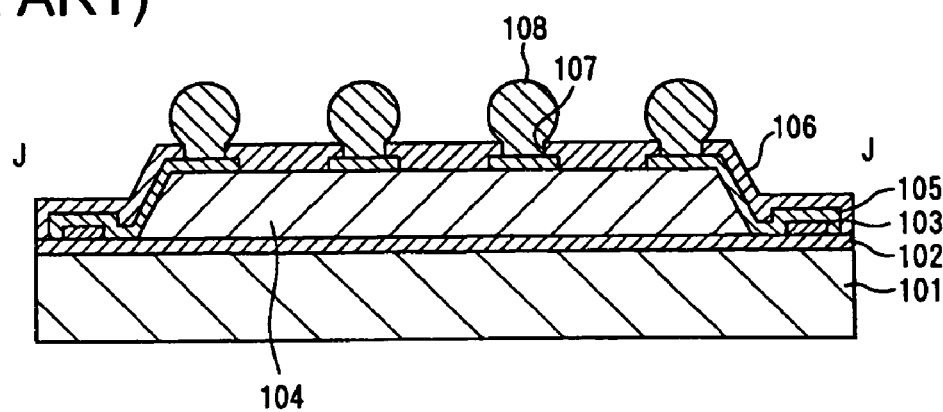

FIG.13 (a) (PRIOR ART)
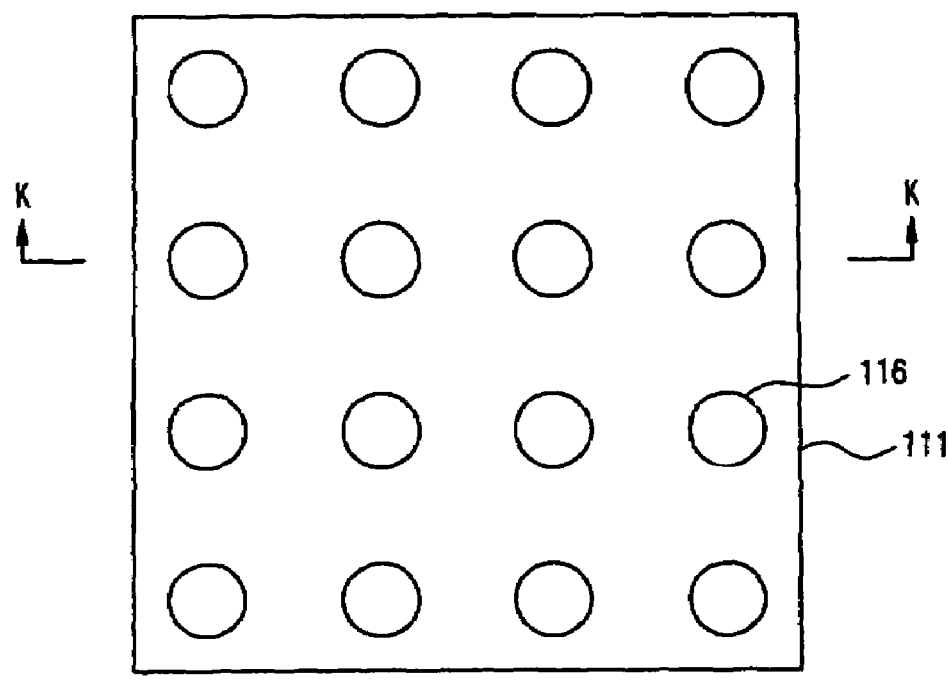
FIG.13 (b) (PRIOR ART)
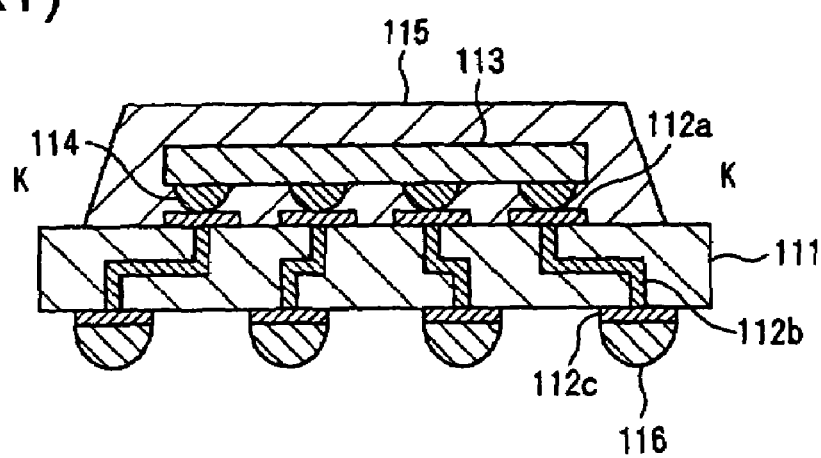

WIRING SUBSTRATE, SEMICONDUCTOR DEVICE, SEMICONDUCTOR MODULE, ELECTRONIC EQUIPMENT, METHOD FOR DESIGNING WIRING SUBSTRATE, METHOD FOR MANUFACTURING SEMICONDUCTOR DEVICE, AND METHOD FOR MANUFACTURING SEMICONDUCTOR MODULE

BACKGROUND OF THE INVENTION

1. Field of Invention

The present invention relates to wiring substrates, semiconductor devices, semiconductor modules, electronic devices, methods for designing wiring substrates, methods for manufacturing semiconductor devices, and methods for manufacturing semiconductor modules. In particular, the present invention can be applied to chip size packages (CSPs) or ball grid arrays (BGAs).

2. Description of Related Art

In chip size packages and ball grid arrays, ball bumps are disposed with full grids or staggered arrangements. FIG. 12 (a) schematically shows a plan view of the structure of a conventional chip size package, and FIG. 12 (b) shows a cross-sectional view taken along lines J—J of FIG. 12 (a). In FIGS. 12(a) and (b), a semiconductor chip 101 includes a wiring layer 102 that is connected to an active region formed thereon, and pad electrodes 103 are formed on the wiring layer 102. Additionally, a stress buffer layer 104 is formed on the active region formed in the semiconductor chip 101 in a manner to expose the pad electrodes 103, and rearrangement wirings 105 are formed on the pad electrodes 103, which extend over the stress buffer layer 104. Further, a solder resist film 106 is formed on the rearrangement wirings 105, and opening sections 107 are formed in the solder resist film 106, which expose the rearrangement wirings 105 on the stress buffer layer 104. Also, solder balls 108 can be formed over the stress buffer layer 104, and the solder balls 108 are connected to the rearrangement wirings 105 through the opening sections 107 formed in the solder resist film 106.

FIG. 13 (a) schematically shows a plan view of the structure of a conventional ball grid array, and FIG. 13 (b) shows a cross-sectional view taken along lines K—K of FIG. 13 (a). In FIGS. 13(a) and (b), wirings 112a and 112c are formed on both surfaces of an interposer substrate 111, and the wirings 112a and 112c formed on the respective surfaces are mutually connected via through hole wirings 112b that are formed in the interposer substrate 111. Further, a semiconductor chip 113 is mounted on a front surface of the interposer substrate 111, and the semiconductor chip 113 is connected to the wirings 112a via bump electrodes 114, and sealed with molding resin 115. Also, solder balls 116 are disposed in a full grid configuration on a back surface of the interposer substrate 111, and the solder balls 116 are connected to the wirings 112c.

SUMMARY OF THE INVENTION

However, in the case of the chip size package shown in FIGS. 12(a) and (b), when the chip size becomes larger, the amount of expansion and contraction of the stress buffer layer 104 and the solder resist layer 106 becomes greater, which causes the semiconductor chip 101 to warp, which in turn leads to poor connections of the solder balls 108 and lowers the reliability in the secondary mounting. In particular, large stresses occur along diagonal lines of the semiconductor chip 101, which frequently causes problems of poor connections among those of the solder balls 108 that are disposed on the diagonal lines or in the four corners of the semiconductor chip 101.

Also, the ball grid array shown in FIG. 13 suffers similar problems. Namely, when the size of the interposer substrate 111 becomes larger, warps of the package are induced, such that poor connections of the solder balls 116 occur and the reliability in the secondary mounting lowers.

In view of the above, it is an object of the present invention to provide wiring substrates, semiconductor devices, semiconductor modules, electronic devices, methods for designing wiring substrates, methods for manufacturing semiconductor devices, and methods for manufacturing semiconductor modules, which can improve the connection reliability of terminal electrodes.

To solve the problems described above, a wiring substrate in accordance with an embodiment of the present invention can include a wiring layer formed on a substrate, and terminal electrodes that can be coupled to the wiring layer and disposed based on a stress distribution that works on the substrate.

As a result, the terminal electrodes can be disposed on the substrate while selecting regions of the substrate having small stresses, and poor connections of the terminal electrodes can be reduced through changing the disposing positions of the terminal electrodes.

As a further result, the connection reliability of the terminal electrodes can be improved without complicating the substrate structure, and the reliability in the secondary mounting can be readily improved.

Also, a wiring substrate in accordance with an embodiment of the present invention can include a wiring layer formed on a substrate, and terminal electrodes that are connected to the wiring layer and disposed on the substrate in a manner to avoid diagonal lines thereof. As a result, the terminal electrodes can be disposed while avoiding regions of the substrate having large stresses, and the connection reliability of the terminal electrodes can be improved without complicating the substrate structure.

Also, a wiring substrate in accordance with an embodiment of the present invention is characterized in having a wiring layer formed on a substrate, terminal electrodes that are connected to the wiring layer and disposed on the substrate, and stress insulation sections provided along diagonal lines of the substrate. As a result, stresses that work on the wiring substrate can be segmented, thereby lowering the stresses that work on the wiring substrate. Accordingly, when the size of the wiring substrate increases, warps of the wiring substrate can be reduced, and the reliability in the secondary mounting can be improved. Also, a wiring substrate in accordance with an embodiment of the present invention is characterized in that the stress insulation sections are at least one of grooves and slits. As a result, stresses that work on the wiring substrate can be shut off at the positions of the grooves or the slits. Even when the size of the wiring substrate increases, stresses that work on the wiring substrate can be lowered, and the reliability in the secondary mounting can be improved.

Also, a wiring substrate in accordance with an embodiment of the present invention is characterized in having a wiring layer formed on a substrate, terminal electrodes that are connected to the wiring layer and disposed on the substrate, and dummy terminals provided in four corners or on diagonal lines of the substrate. As a result, while terminal electrodes are prevented from being disposed in regions where poor connections frequently occur, the connection state of the terminal electrodes can be reinforced by the dummy terminals.

For this reason, when the size of the wiring substrate is enlarged, stresses that work on the wiring substrate can be lowered, and poor connections of the terminal electrodes can be reduced, such that the reliability in the secondary mounting can be improved.

Also, a semiconductor device in accordance with an embodiment of the present invention can include a semiconductor chip having an active region and pad electrodes formed thereon, a stress buffer layer formed over the active region, bump electrodes that are formed on the stress buffer layer and disposed based on a stress distribution that works on the semiconductor chip, rearrangement wiring layers that connect the bump electrodes and the pad electrodes, and a protection layer that is formed over the rearrangement wiring layers and the pad electrodes.

As a result, the pad electrodes can be disposed in regions where stresses that work on the semiconductor chip are small, and poor connections of the bump electrodes can be reduced by changing the disposing positions of the bump electrodes. For this reason, the reliability in connecting the bump electrodes can be improved without complicating the structure of the chip size package, and the reliability in the secondary mounting can be readily improved.

Also, a semiconductor device in accordance with an embodiment of the present invention can include a semiconductor chip having an active region and pad electrodes formed thereon, a stress buffer layer formed on the active region; bump electrodes that are formed on the stress buffer layer and disposed in a manner to avoid diagonal lines thereof, rearrangement wiring layers that connect the bump electrodes and the pad electrodes, and a protection layer that is formed over the rearrangement wiring layers and the pad electrodes. As a result, the bump electrodes can be disposed while avoiding regions where stresses that work on the semiconductor chip are large, and the reliability in connecting the bump electrodes can be improved without complicating the structure of the chip size package.

Also, a semiconductor device in accordance with an embodiment of the present invention can have a semiconductor chip having an active region and pad electrodes formed thereon, stress buffer layers that are formed on the active region, and divided and disposed along diagonal lines, bump electrodes formed on the stress buffer layers, rearrangement wiring layers that connect the bump electrodes and the pad electrodes, and protection layers that are formed over the rearrangement wiring layers and the pad electrodes, and divided and disposed along the diagonal lines. As a result, stresses that work on the stress buffer layer and the protection layers can be segmented, to thereby lower the stresses that work on the semiconductor chip. Accordingly, when the size of the semiconductor chip increases, warps of the semiconductor chip can be reduced, such that the reliability in the secondary mounting can be improved.

Also, a semiconductor device in accordance with an embodiment of the present invention can include a semiconductor chip having an active region and pad electrodes formed thereon, a stress buffer layer that is formed on the active region; bump electrodes formed on the stress buffer layer, dummy bumps provided in four corners or on diagonal lines of the stress buffer layer, rearrangement wiring layers that connect the bump electrodes and the pad electrodes, and a protection layer that is formed over the rearrangement wiring layers and the pad electrodes. As a result, the bump electrodes can be prevented from being disposed in regions where poor connections frequently occur, and the connection state of the bump electrodes can be reinforced by the dummy bumps. Also, the bump electrodes and dummy bumps can be formed collectively and connected collectively.

For this reason, when the size of the semiconductor chip is enlarged, stresses that work on the semiconductor chip can be lowered without complicating the manufacturing process, and poor connections of the bump electrodes can be reduced.

Further, a semiconductor module in accordance with an embodiment of the present invention can include an interposer substrate having a semiconductor chip surface-mounted thereon, a wiring layer provided on a back surface of the interposer substrate bump electrodes that are connected to the wiring layer and disposed based on a stress distribution that works on the interposer substrate, and through hole wirings that are provided in the interposer substrate and connect the semiconductor chip and the wiring layer.

As a result, the bump electrodes can be disposed in regions where stresses that work on the interposer substrate are small, and poor connections of the bump electrodes can be reduced by changing the disposing positions of the bump electrodes.

For this reason, the reliability in connecting the bump electrodes can be improved without complicating the structure of the ball grid array, and the reliability in the secondary mounting can be readily improved.

Also, a semiconductor module in accordance with an embodiment of the present invention can include an interposer substrate having a semiconductor chip surface-mounted thereon, a wiring layer provided on a back surface of the interposer substrate, bump electrodes that are connected to the wiring layer and disposed on the back surface of the interposer substrate in a manner to avoid diagonal lines, and through hole wirings that are provided in the interposer substrate and connect the semiconductor chip and the wiring layer. As a result, the bump electrodes can be disposed while avoiding regions where stresses that work on the interposer substrate are large, and the reliability in connecting the bump electrodes can be improved without complicating the structure of the ball grid array.

Also, a semiconductor module in accordance with an embodiment of the present invention can include an interposer substrate having a semiconductor chip surface-mounted thereon, a wiring layer provided on a back surface of the interposer substrate, bump electrodes that are connected to the wiring layer and disposed on the back surface of the interposer substrate in a manner to avoid diagonal lines, at least one of grooves and slits provided along diagonal lines of the interposer substrate, and through hole wirings that are provided in the interposer substrate and connect the semiconductor chip and the wiring layer. As a result, stresses that work on the interposer substrate can be segmented to thereby lower the stresses that work on the interposer substrate. Accordingly, even when the size of the interposer substrate increases, warps of the interposer substrate can be reduced, and the reliability in the secondary mounting can be improved.

Further, a semiconductor module in accordance with an embodiment of the present invention can include an interposer substrate having a semiconductor chip surface-mounted thereon, a wiring layer provided on a back surface of the interposer substrate, bump electrodes that are connected to the wiring layer and disposed on the back surface of the interposer substrate, dummy bumps provided in four corners or on diagonal lines of the back surface of the interposer substrate, and through hole wirings that are provided in the interposer substrate and connect the semiconductor chip and the wiring layer.

As a result, the bump electrodes can be prevented from being disposed in regions where poor connections frequently occur, and the connection state of the bump electrodes can be reinforced by the dummy bumps. Also, the bump electrodes and dummy bumps can be formed collectively and connected collectively. For this reason, when the size of the interposer substrate is enlarged, stresses that work on the interposer substrate can be lowered without complicating the manufacturing process, and poor connections of the bump electrodes can be reduced.

Further, an electronic device in accordance with an embodiment of the present invention can include an interposer substrate having a semiconductor chip surface-mounted thereon, a wiring layer provided on a back surface of the interposer substrate, bump electrodes that are connected to the wiring layer and disposed on the back surface of the interposer substrate in a manner to avoid diagonal lines, through hole wirings that are provided in the interposer substrate and connect the semiconductor chip and the wiring layer, a mother substrate having the interposer substrate mounted thereon, and an electronic component that is connected to the bump electrodes through the mother substrate. As a result, stresses that work on the interposer substrate can be segmented to thereby lower the stresses that work on the interposer substrate, and the reliability in mounting the interposer substrate on the mother substrate can be improved.

Also, a method for designing a wiring substrate in accordance with an embodiment of the present invention can be characterized in that, based on a stress distribution that works on a wiring substrate, disposing positions of bump electrodes on the wiring substrate are determined. As a result, the bump electrodes can be disposed in regions where stresses that work on the wiring substrate are small, and poor connections of the bump electrodes can be reduced by merely adjusting the disposing positions of the bump electrodes, even when the size of the wiring substrate is enlarged.

Also, a method for designing a wiring substrate in accordance with an embodiment of the present invention can be characterized in that the disposing positions of the bump electrodes on the wiring substrate are determined in a manner to avoid diagonal lines of the wiring substrate. As a result, the bump electrodes can be prevented from being disposed in regions where stresses that work on the wiring substrate are large, and the connection reliability of the bump electrodes can be improved by merely adjusting the disposing positions of the bump electrodes.

Further, a method for manufacturing a semiconductor device in accordance with an embodiment of the present invention can include a step of forming a stress buffer layer on an active region of a semiconductor chip having pad electrodes formed thereon, a step of exposing the pad electrodes by patterning the stress buffer layer, a step of forming rearrangement wiring layers that extend from the pad electrodes over the stress buffer layer, a step of forming a protection layer over the rearrangement wiring layers, a step of forming opening sections that expose the rearrangement wiring layers in a manner to avoid diagonal line by patterning the protection layer, and a step of forming, on the stress buffer layer, bump electrodes that are connected to the rearrangement wiring layers through the opening sections.

As a result, the bump electrodes can be prevented from being disposed in regions where stresses that work on the semiconductor chip are large, and the connection reliability of the bump electrodes can be improved by merely adjusting the disposing positions of the bump electrodes. For this reason, the reliability in connecting the bump electrodes can be improved without complicating the structure of the chip size package, and the reliability in the secondary mounting can be readily improved.

Further, a method for manufacturing a semiconductor device in accordance with an embodiment of the present invention can include a step of forming a stress buffer layer on an active region of a semiconductor chip having pad electrodes formed thereon, a step of dividing the stress buffer layer along diagonal lines and exposing the pad electrodes by patterning the stress buffer layer, a step of forming rearrangement wiring layers that extend from the pad electrodes over the stress buffer layer, a step of forming a protection layer over the rearrangement wiring layers, a step of forming opening sections that divide the protection layer along the diagonal lines and expose the rearrangement wiring layers by patterning the protection layer, and a step of forming, on the stress buffer layer, bump electrodes that are connected to the rearrangement wiring layers through the opening sections.

As a result, stresses that work on the stress buffer layer and the protection layer can be segmented by merely patterning the stress buffer layer and the protection layer, and the connection reliability of the bump electrodes can be improved without increasing the number of manufacturing steps even when the size of the semiconductor chip is enlarged.

Also, a method for manufacturing a semiconductor device in accordance with an embodiment of the present invention can include a step of forming a stress buffer layer on an active region of a semiconductor chip having pad electrodes formed thereon, a step of exposing the pad electrodes by patterning the stress buffer layer, a step of forming rearrangement wiring layers that extend from the pad electrodes over the stress buffer layer, and dummy lands in four corners or on diagonal lines on the stress buffer layer, a step of forming a protection layer over the rearrangement wiring layers and the dummy lands, a step of forming, by patterning the protection layer, first opening sections that expose the rearrangement wiring layers and second opening sections that expose the dummy lands; and a step of forming, on the stress buffer layer, bump electrodes that are connected to the rearrangement wiring layers through the first opening sections, and forming dummy bumps disposed over the dummy lands through the second opening sections.

As a result, the bump electrodes can be prevented from being disposed in regions where poor connections frequently occur, and the bump electrodes and the dummy bumps can be collectively formed. Also, by connecting the bump electrodes, the connection state of the bump electrodes can be reinforced by the dummy bumps. For this reason, even when the size of the semiconductor chip is enlarged, stresses that work on the semiconductor chip can be lowered, and poor connections of the bump electrodes can be reduced without complicating the manufacturing process.

Also, a method for manufacturing a semiconductor module in accordance with an embodiment of the present invention can include a step of forming wiring layers connected via through holes on both sides of an interposer substrate, a step of forming bump electrodes connected to the wiring layer on a back surface of the interposer substrate in a manner to avoid diagonal lines, and a step of mounting a semiconductor chip on a front surface of the interposer substrate.

As a result, the bump electrodes can be prevented from being disposed in regions where stresses that work on the interposer substrate are large, and poor connections of the bump electrodes can be reduced by merely adjusting the disposing positions of the bump electrodes. For this reason, the connection reliability of the bump electrodes can be improved without complicating the structure of the ball grid array, and the reliability in the secondary mounting can be readily improved.

Also, a method for manufacturing a semiconductor module in accordance with an embodiment of the present invention can include a step of forming at least one of grooves and slits along diagonal lines of an interposer substrate, a step of forming wiring layers connected via through holes on both sides of the interposer substrate, a step of forming bump electrodes connected to the wiring layer on a back surface of the interposer substrate, and a step of mounting a semiconductor chip on a front surface of the interposer substrate.

As a result, stresses that work on the interposer substrate can be segmented by forming the grooves or the slits in the interposer substrate. Even when the size of the interposer substrate is enlarged, the connection reliability of the bump electrodes can be improved while suppressing an increase in the manufacturing steps.

Also, a method for manufacturing a semiconductor module in accordance with an embodiment of the present invention can include a step of forming wiring layers connected via through holes on both sides of the interposer substrate, and forming dummy lands in four corners or on diagonal lines of a back surface of the interposer substrate, a step of forming bump electrodes connected to the wiring layer on the back surface of the interposer substrate, and forming dummy bumps on the dummy lands, and a step of mounting a semiconductor chip on a front surface of the interposer substrate.

As a result, the bump electrodes can be prevented from being disposed in regions where poor connections frequently occur, and the bump electrodes and dummy bumps can be formed collectively, and the connection state of the bump electrodes can be reinforced by the dummy bumps by connecting the bump electrodes. For this reason, when the size of the interposer substrate is enlarged, stresses that work on the interposer substrate can be lowered without complicating the manufacturing process, and poor connections of the bump electrodes can be reduced.

BRIEF DESCRIPTION OF THE DRAWINGS

The invention will be described with reference to the accompanying drawings, wherein like numerals reference like elements, and wherein:

FIGS. 12a and 12b are views illustrating the structure of a conventional chip size package; and FIGS. 13a and 13b are views illustrating the structure of a conventional ball grid array.

DETAILED DESCRIPTION OF PREFERRED EMBODIMENTS

Hereunder, a semiconductor device and a semiconductor module in accordance with embodiments of the present invention will be described by using a chip size package and a ball grid array as examples.

Figure 1:
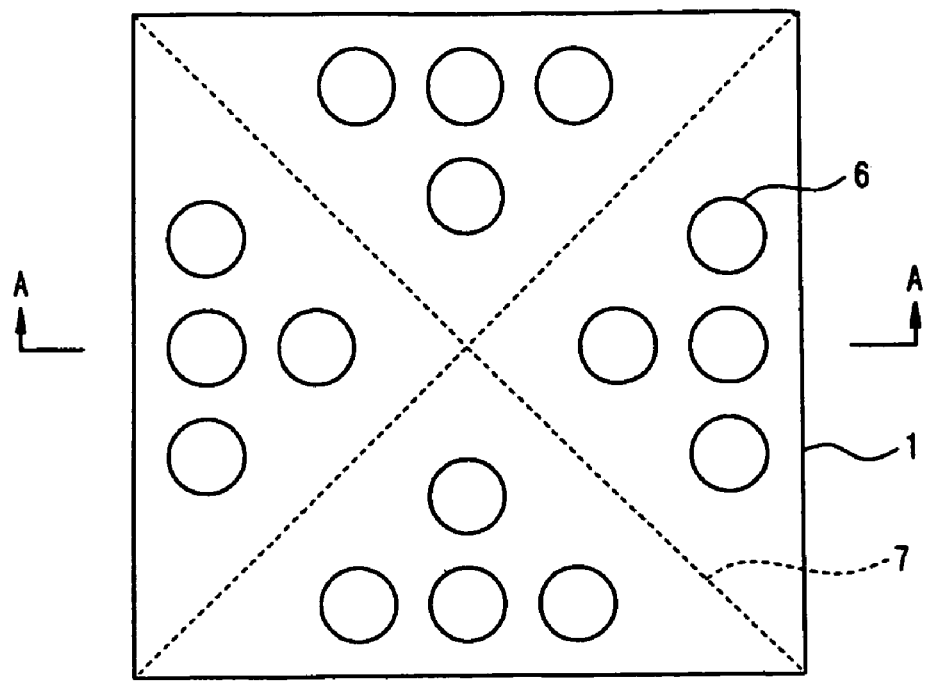
FIGS. 1a and 1b are views illustrating the structure of a ball grid array in accordance with a first embodiment of the present invention.
Figure 1:
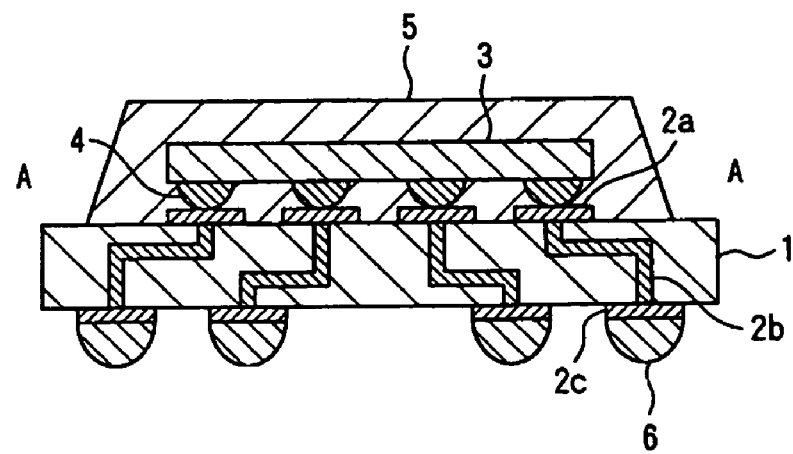

FIG. 1 (a) schematically shows a plan view of the structure of a ball grid array in accordance with a first embodiment of the present invention, and FIG. 1 (b) shows a cross-sectional view taken along lines A—A of FIG. 1 (a).

Referring to FIG. 1, wirings 2a and 2c are formed on both surfaces of an interposer substrate 1, respectively, and the wirings 2a and 2c formed on the respective surfaces are connected to one another via through hole wirings 2b that are formed in the interposer substrate 1.

Further, a semiconductor chip 3 is mounted on a front surface of the interposer substrate 1, and the semiconductor chip 3 is connected to the wirings 2a through the bump electrodes 4, and sealed with mold resin 5.

Also, for example, solder balls 6 as terminal electrodes are disposed on a back surface of the interposer substrate 1, and the solder balls 6 are connected to the wirings 2c. Here, the solder balls 6 are disposed in a manner to avoid diagonal lines 7 of the interposer substrate 1. As a result, the solder balls 6 can be prevented from being disposed in regions where stresses that work on the interposer substrate 1 are large, and the connection reliability of the solder balls 6 can be improved by merely adjusting the disposing positions of the solder balls 6. For this reason, even when the ball grid array becomes to be a large size, the connection reliability of the solder balls 6 can be improved without complicating the structure of the ball grid array, and the reliability in the secondary mounting of the ball grid array can be improved while restricting an increase in the cost.

As the interposer substrate 1, for example, a silicon substrate, a ceramics substrate, a glass epoxy substrate, or a build-up multi-layered substrate can be used. Also, as the terminal electrodes provided on the back surface of the interposer substrate 1, for example, Au bump electrodes, or bump electrodes composed of Ni bumps covered with Au films or solder films may be used, besides the solder balls 6.

Figure 2:
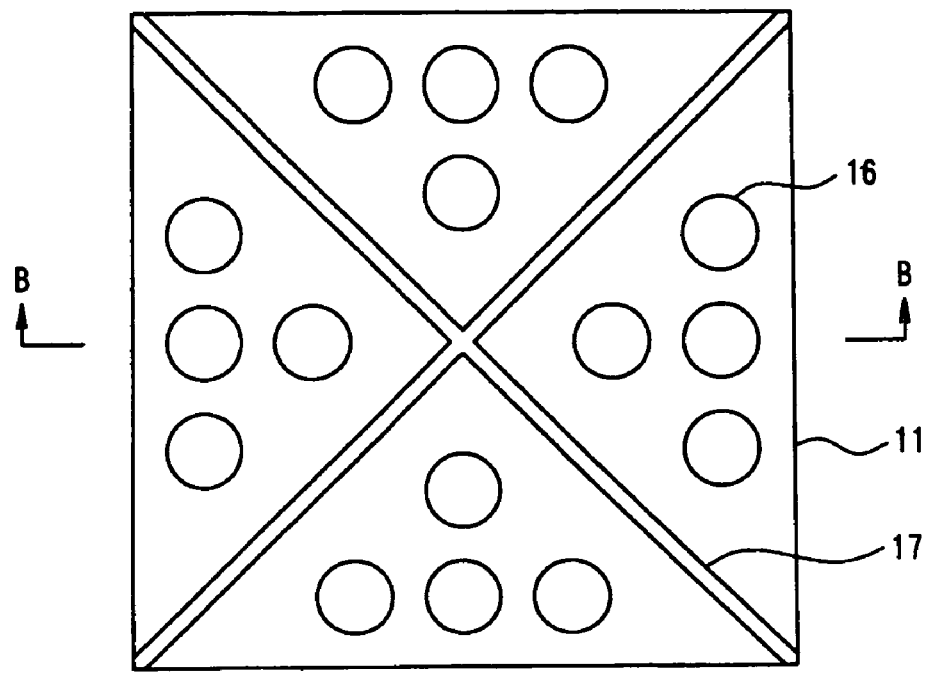
FIGS. 2a and 2b are views illustrating the structure of a ball grid array in accordance with a second embodiment of the present invention.
Figure 2:
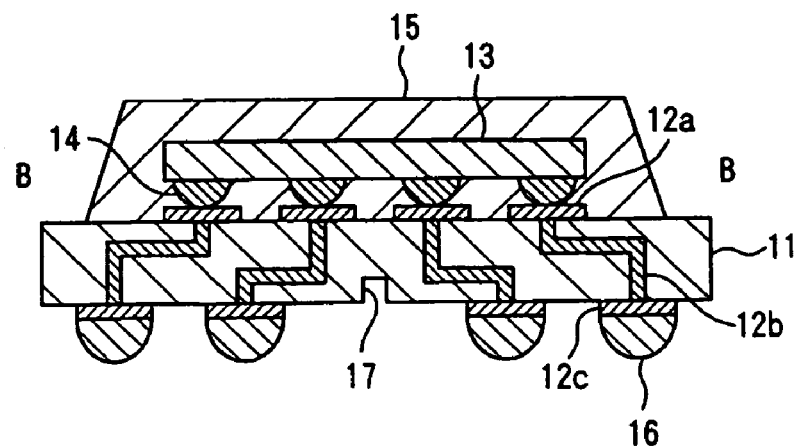

FIG. 2 (a) schematically shows a plan view of the structure of a ball grid array in accordance with a second embodiment of the present invention, and FIG. 2 (b) shows a cross-sectional view taken along lines B—B of FIG. 2 (a).

In FIG. 2, wirings 12a and 12c are formed on both surfaces of an interposer substrate 11, respectively, and the wirings 12a and 12c formed on the respective surfaces are connected to one another via through hole wirings 12b that are formed in the interposer substrate 11. Further, a semiconductor chip 13 is mounted on a front surface of the interposer substrate 11, and the semiconductor chip 13 is connected to the wirings 12a through bump electrodes 14, and sealed with mold resin 15.

Also, for example, solder balls 16 as terminal electrodes are disposed on a back surface of the interposer substrate 11, and the solder balls 16 are connected to the wirings 12c. Here, the solder balls 16 are disposed in a manner to avoid diagonal lines of the interposer substrate 11, and grooves 17 are formed along the diagonal lines in the interposer substrate 11.

For this reason, stresses that work on the interposer substrate 11 can be segmented, to thereby lower the stresses applied to the interposer substrate 11 can be lowered and, even when the size of the interposer substrate 11 is enlarged, warps of the interposer substrate 11 can be reduced, and the reliability in the secondary mounting can be improved.

It is noted that, in the embodiment described above, a method in which the grooves 17 are provided along the diagonal lines of the interposer substrate 11 is described. However, it should be understood that holes or slits may be provided instead of the grooves 17. Also, combinations of grooves and holes or slits may be mixed and provided.

Figure 3:
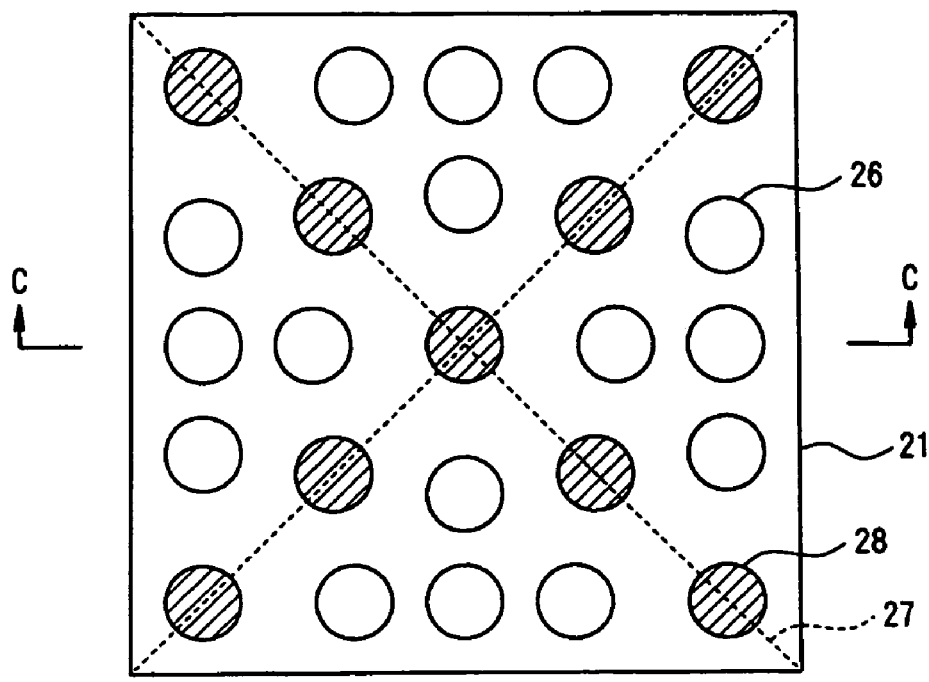
FIGS. 3a and 3b are views illustrating the structure of a ball grid array in accordance with a third embodiment of the present invention.
Figure 3:
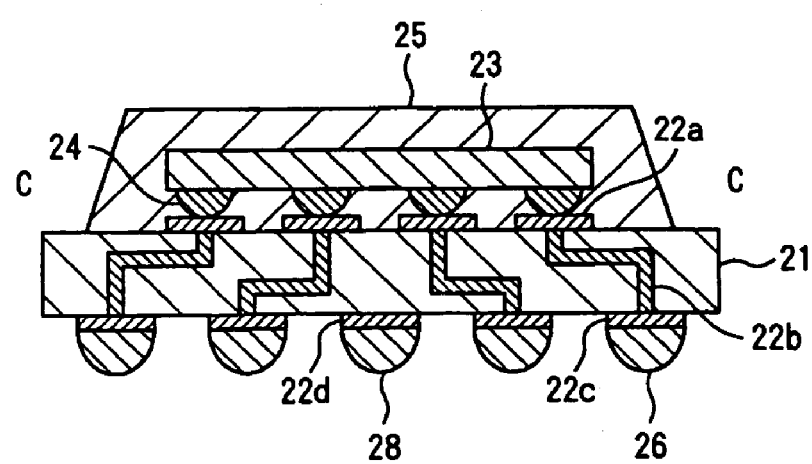

FIG. 3 (a) schematically shows a plan view of the structure of a ball grid array in accordance with a third embodiment of the present invention, and FIG. 3 (b) shows a cross-sectional view taken along lines C—C of FIG. 3 (a).

In FIG. 3, wirings 22a are formed on a front surface of an interposer substrate 21, and wirings 22c and dummy lands 22d having dummy balls 28 disposed thereon are formed on a back surface of the interposer substrate 21. The wirings 22a and 22c formed on the respective surfaces are connected to one another via through hole wirings 22b that are formed in the interposer substrate 21. Further, a semiconductor chip 23 is mounted on the front surface of the interposer substrate 21, and the semiconductor chip 23 is connected to the wirings 22a through bump electrodes 24, and sealed with mold resin 25. Also, for example, solder balls 26 and dummy balls 28 respectively as terminal electrodes and dummy terminals are disposed on the back surface of the interposer substrate 21, and the solder balls 26 are connected to the wirings 22c, and the dummy balls 28 are disposed on the dummy lands 22d.

Here, the solder balls 26 can be disposed in a manner to avoid diagonal lines of the interposer substrate 21, and the dummy balls 28 are disposed at predetermined intervals on the diagonal lines 27 of the interposer substrate 21. As a result, the solder balls 26 are prevented from being disposed on the diagonal lines 27 where large stresses are generated, and the dummy balls 28 can be disposed in regions where the solder balls 26 are not disposed, such that the connection state of the solder balls 26 can be reinforced by the dummy balls 28. For this reason, even when the size of the interposer substrate 21 is enlarged, stresses that work on the interposer substrate 21 can be lowered, and poor connections of the solder balls 26 can be reduced, and the reliability in the secondary mounting can be readily improved.

It is noted that the solder balls 26 and the dummy balls 28 may be made of the same material and in the same size and shape. However, the solder balls 26 and the dummy balls 28 may be made of different material and in different sizes and shapes. When the solder balls 26 and the dummy balls 28 are made of the same material and in the same size and shape, the solder balls 26 and the dummy balls 28 can be collectively formed, which prevents the manufacturing process from becoming complex. On the other hand, when the solder balls 26 and the dummy balls 28 are made of different material, the solder balls 26 and the dummy balls 28 can have different bonding forces. Therefore, even when the dummy balls 28 are disposed on the diagonal line 27, the dummy balls 28 are difficult to come off, and poor connections of the solder balls 26 can be reduced.

For example, the dummy balls 28 can be composed of resin balls covered with solder. By this, flexible deformation can readily occur in the dummy balls 28, such that the dummy balls 28 become difficult to come off even when deforming stresses work on the dummy balls 28. Accordingly, poor connections of the dummy balls 28 can be reduced, and poor connections of the solder balls 26 can be reduced.

Also, as the dummy balls 28 are covered with solder, the dummy balls 28 can be flexibly deformed, and the solder balls 26 and the dummy balls 28 can be collectively connected, and therefore the manufacturing process is prevented from becoming complex.

Figure 4:
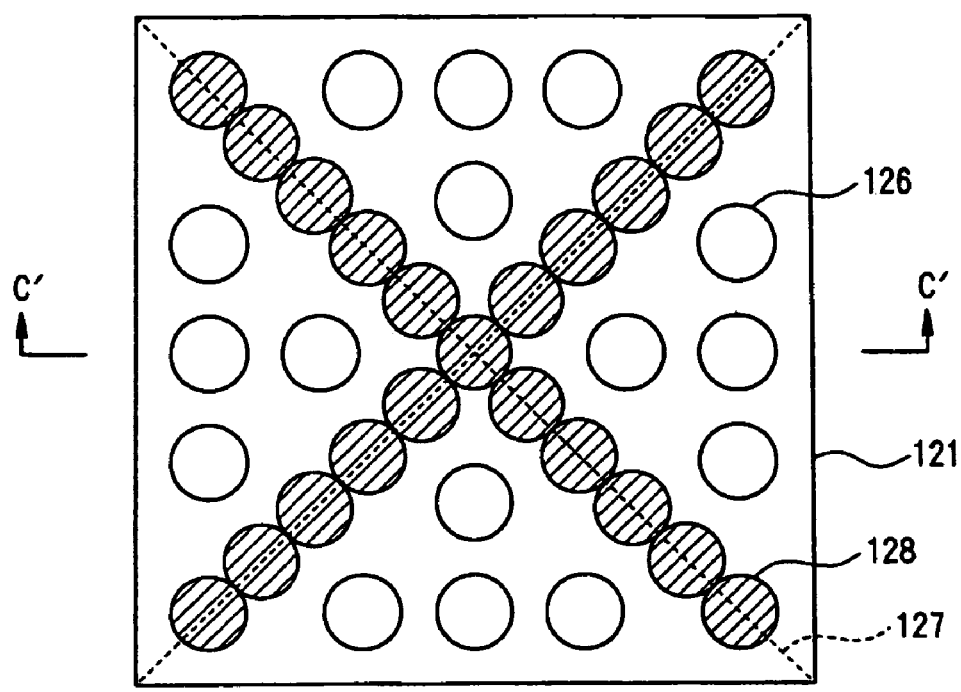
FIGS. 4a and 4b are views illustrating the structure of a ball grid array in accordance with a fourth embodiment of the present invention.
Figure 4:
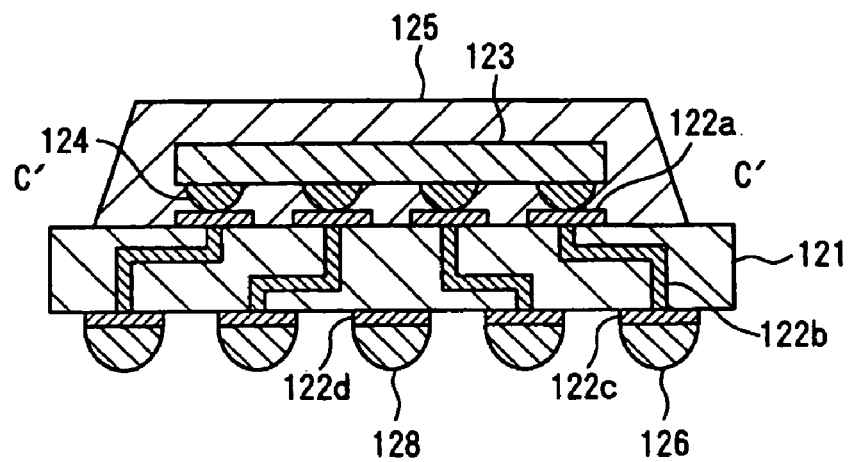

FIG. 4 (a) schematically shows a plan view of the structure of a ball grid array in accordance with a fourth embodiment of the present invention, and FIG. 4 (b) shows a cross-sectional view taken along lines C'—C' of FIG. 4 (a).

In FIG. 4, wirings 122a are formed on a front surface of an interposer substrate 121, and wirings 122c and dummy lands 122d having dummy balls 128 disposed thereon are formed on a back surface of the interposer substrate 121. The wirings 122a and 122c formed on the respective surfaces are connected to one another via through hole wirings 122b that are formed in the interposer substrate 121.

Further, a semiconductor chip 123 is mounted on the front surface of the interposer substrate 121, and the semiconductor chip 123 is connected to the wirings 122a through bump electrodes 124, and sealed with mold resin 125. Also, for example, solder balls 126 and dummy balls 128 as terminal electrodes and dummy terminals are disposed on the back surface of the interposer substrate 121, and the solder balls 126 are connected to the wirings 122c, and the dummy balls 128 are disposed on the dummy lands 122d. Here, the solder balls 126 are disposed in a manner to avoid diagonal lines 127 of the interposer substrate 121, and the dummy balls 128 are continuously disposed on the diagonal lines 127 of the interposer substrate 121 so that they are in contact with one another.

As a result, the solder balls 126 can be prevented from being disposed on the diagonal lines 127 where large stresses are generated, and the connection state of the solder balls 126 can be reinforced by the dummy balls 128, and the bonding force by the dummy balls 128 can be readily increased without changing the size of the dummy balls 128. For this reason, the bonding force by the dummy balls 128 can be increased, and the solder balls 126 and the dummy balls 128 can be collectively formed and collectively connected, and stresses that are generated in the interposer substrate 121 can be effectively absorbed without complicating the manufacturing process.

Figure 5:
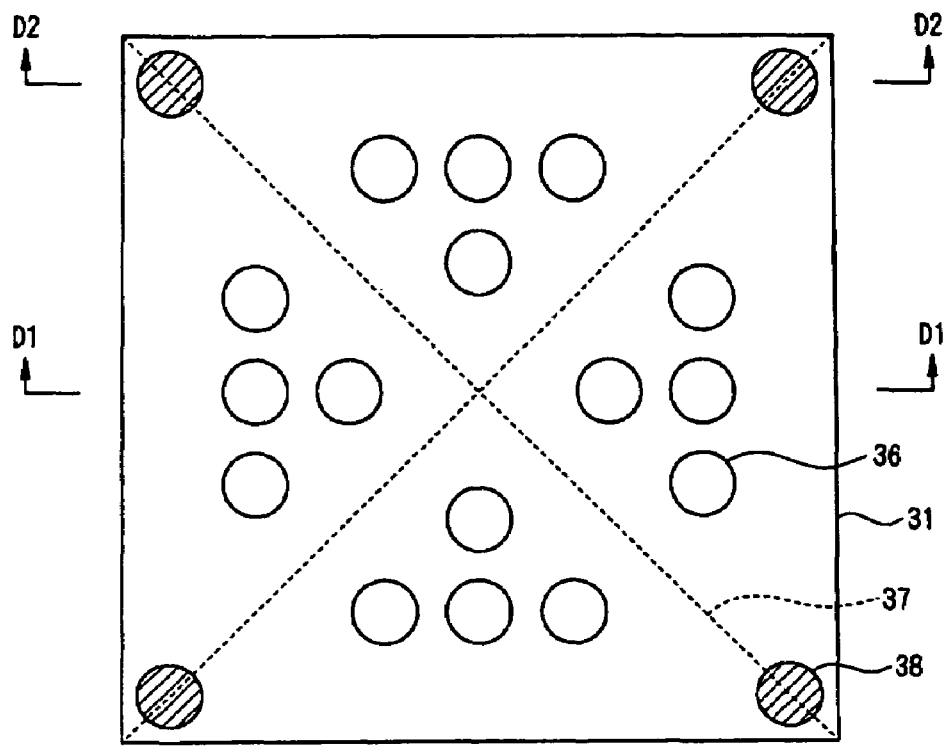
FIGS. 5a–5c are views illustrating the structure of a ball grid array in accordance with a fifth embodiment of the present invention.
Figure 5:
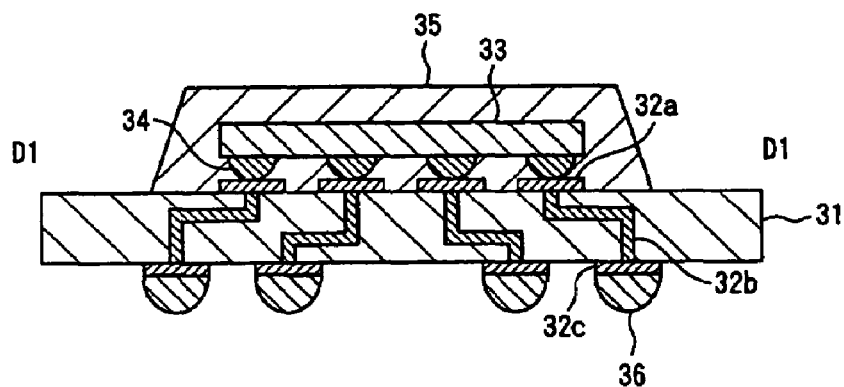
Figure 5:
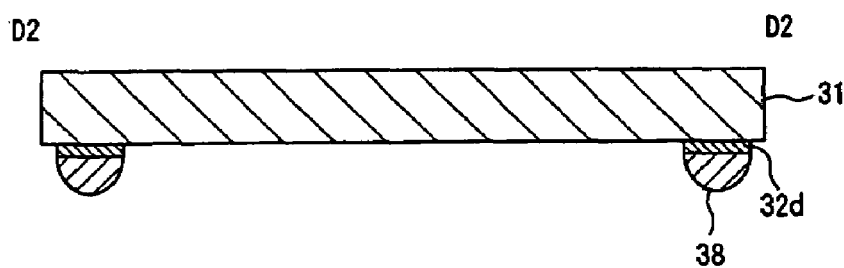

FIG. 5 (a) schematically shows a plan view of the structure of a ball grid array in accordance with a fifth embodiment of the present invention, FIG. 5 (b) shows a cross-sectional view taken along lines D1—D1 of FIG.

5 (*a*), and FIG. 5 (*c*) shows a cross-sectional view taken along lines D2—D2 of FIG. 5 (*a*).

Referring to FIG. 5, wirings 32*a* are formed on a front surface of an interposer substrate 31, and wirings 32*c* and dummy lands 32*d* having dummy balls 38 disposed thereon are formed on a back surface of the interposer substrate 31. The wirings 32*a* and 32*c* formed on the respective surfaces are connected to one another via through hole wirings 32*b* that are formed in the interposer substrate 31. Further, a semiconductor chip 33 is mounted on the front surface of the interposer substrate 31, and the semiconductor chip 33 is connected to the wirings 32*a* through bump electrodes 34, and sealed with mold resin 35. Also, for example, solder balls 36 and dummy balls 38 respectively as terminal electrodes and dummy terminals are disposed on the back surface of the interposer substrate 31, and the solder balls 36 are connected to the wirings 32*c*, and the dummy balls 38 are disposed on the dummy lands 32*d*.

Here, the solder balls 36 are disposed inside the interposer substrate 31 in a manner to avoid diagonal lines 37 of the interposer substrate 31, and the dummy balls 38 are disposed in the four corners at the outermost circumference of the interposer substrate 31. Accordingly, the solder balls 36 are prevented from being disposed in regions where large stresses are generated, and the stresses generated in the interposer substrate 31 can be effectively absorbed by the dummy balls 38, and the reliability in the secondary mounting can be readily improved.

Figure 6:
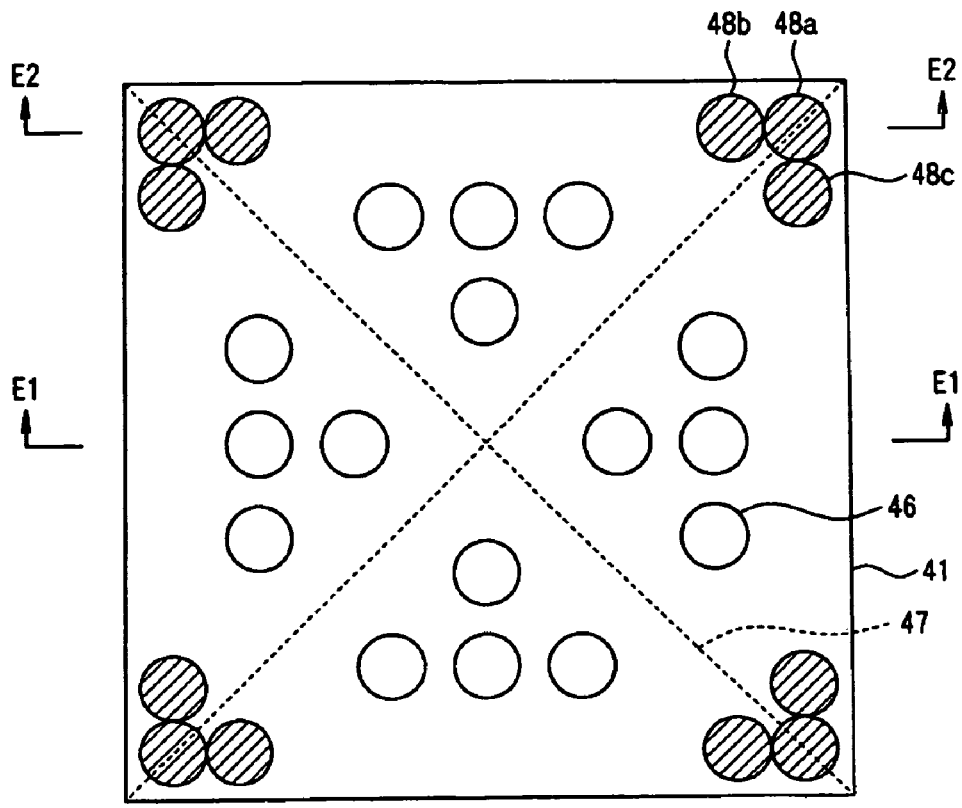
FIGS. 6a–6c are views illustrating the structure of a ball grid array in accordance with a sixth embodiment of the present invention.
Figure 6:
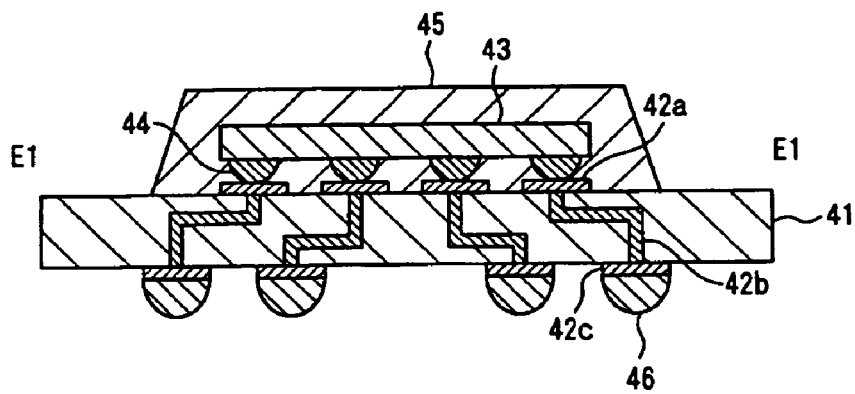
Figure 6:
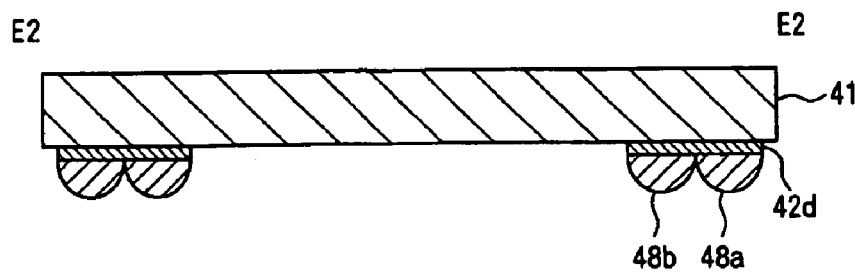

FIG. 6 (*a*) schematically shows a plan view of the structure of a ball grid array in accordance with a sixth embodiment of the present invention, FIG. 6 (*b*) shows a cross-sectional view taken along lines E1—E1 of FIG. 6 (*a*), and FIG. 6 (*c*) shows a cross-sectional view taken along lines E2—E2 of FIG. 6 (*a*).

Referring to FIG. 6, wirings 42*a* are formed on a front surface of an interposer substrate 41, and wirings 42*c* and dummy lands 42*d* having dummy balls 48*a*–48*c* disposed thereon are formed on a back surface of the interposer substrate 41. The wirings 42*a* and 42*c* formed on the respective surfaces are connected to one another via through hole wirings 42*b* that are formed in the interposer substrate 41.

Further, a semiconductor chip 43 is mounted on the front surface of the interposer substrate 41, and the semiconductor chip 43 is connected to the wirings 42*a* through bump electrodes 44, and sealed with mold resin 45. Also, for example, solder balls 46 and dummy balls 48 respectively as terminal electrodes and dummy terminals are disposed on the back surface of the interposer substrate 41, and the solder balls 46 are connected to the wirings 42*c*, and the dummy balls 48 are disposed on the dummy lands 42*d*.

Here, the solder balls 46 are disposed inside the interposer substrate 41 in a manner to avoid diagonal lines 47 of the interposer substrate 41, and the dummy balls 48*a*–48*c* are disposed in contact with one another in each of the four corners of the interposer substrate 41. By this, the bonding force by the dummy balls 48*a*–48*c* can be increased by merely adjusting the disposing positions of the dummy balls 48*a*–48*c*, and the size of the dummy balls 48*a*–48*c* does not need to be changed for increasing the bonding force by the dummy balls 48*a*–48*c*.

For this reason, the solder balls 46 and the dummy balls 48*a*–48*c* can be collectively formed and collectively connected, and stresses that are generated in the interposer substrate 41 can be effectively absorbed without complicating the manufacturing process.

Figure 7:
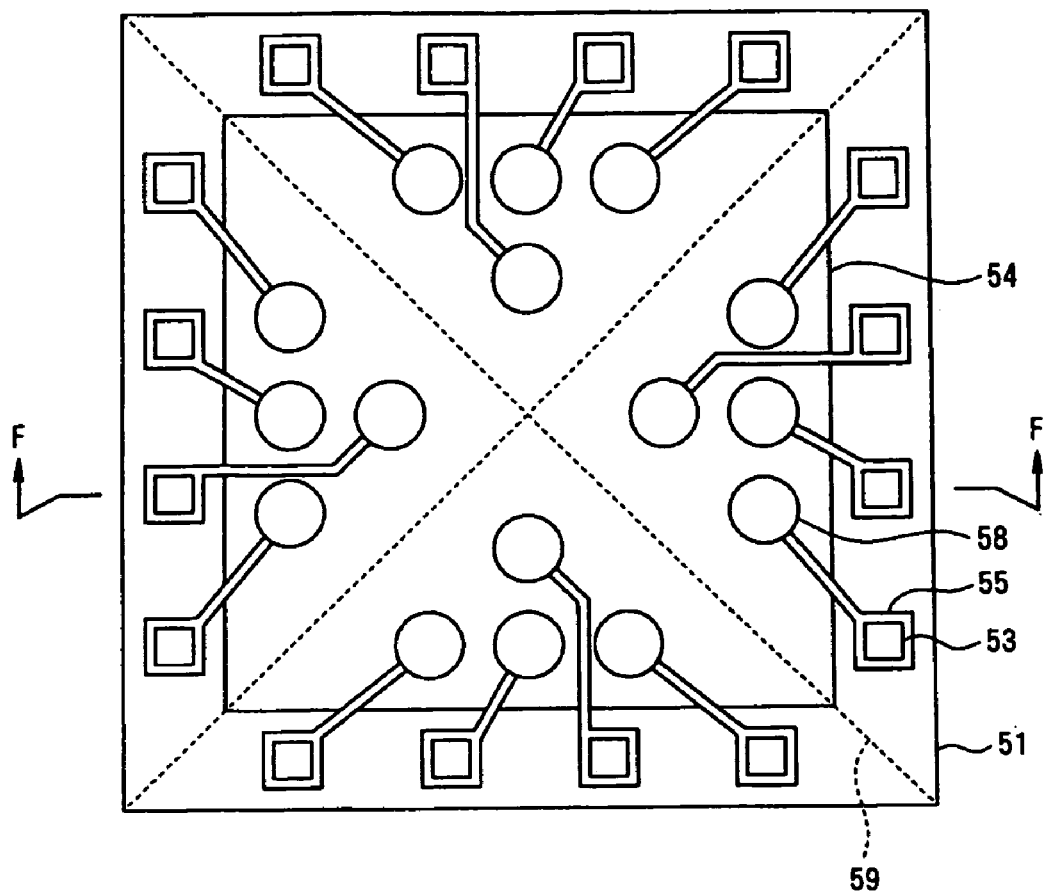
FIGS. 7a and 7b are views illustrating the structure of a chip size package in accordance with a seventh embodiment of the present invention.
Figure 7:
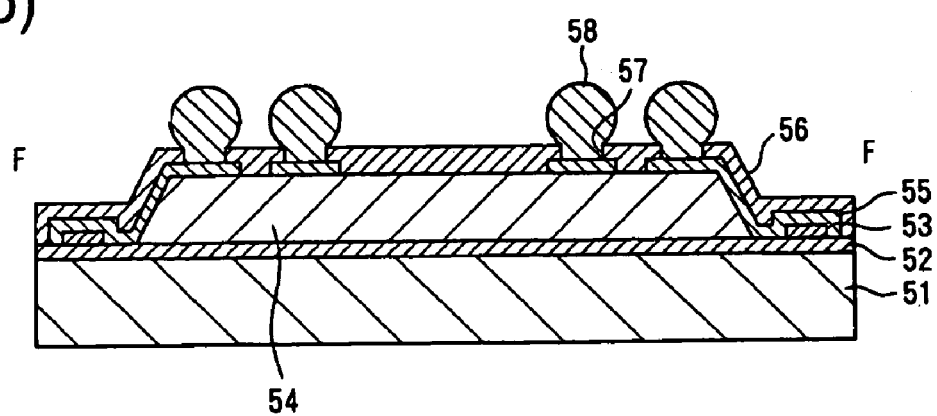

FIG. 7 (*a*) schematically shows a plan view of the structure of a chip size package in accordance with a seventh embodiment of the present invention, and FIG. 7 (*b*) shows a cross-sectional view taken along lines F—F of FIG. 7 (*a*).

Referring to FIG. 7, a wiring layer 52 connected to an active region is formed on a semiconductor chip 51, and pad electrodes 53 are formed on the wiring layer 52. Also, a stress buffer layer 54 is formed on the active region that is formed on the semiconductor chip 51 in a manner to expose the pad electrodes 53. Rearrangement wirings 55 extending over the stress buffer layer 54 are formed on the pad electrodes 53. Here, the rearrangement wiring 55 can be composed of, for example, a three-layer structure including a TiW-sputtered wiring layer, a Cu-sputtered wiring layer and a Cu-plated wiring layer. Also, a protection layer, such as, for example, a solder resist film 56 is formed on the rearrangement wirings 55, and opening sections 57 that expose the rearrangement wirings 55 over the stress buffer layer 54 are formed in the solder resist film 56.

Furthermore, as bump electrodes, for example, solder balls 58 are disposed on the stress buffer layer 54, and the solder balls 58 are connected to the rearrangement wirings 55 via the opening sections 57 formed in the solder resist film 56. Here, the solder balls 58 are disposed in a manner to avoid diagonal lines 59 of the semiconductor chip 51.

By this, the solder balls 58 can be disposed while avoiding regions where stresses working on the semiconductor chip 51 are large, and the connection reliability of the solder balls 58 can be improved by merely adjusting the disposing position of the solder balls 58.

For this reason, even when the chip size package becomes large, poor connections of the solder balls 58 can be reduced without complicating the structure of the chip size package, an increase in the cost can be restricted, and the reliability in the secondary mounting of the chip size package can be improved.

It is noted that, as the bump electrodes provided on the stress buffer layer 54, for example, Au bump electrodes, or bump electrodes composed of Ni bumps covered with Au films or solder films may be used, besides the solder balls 58.

Figure 8:
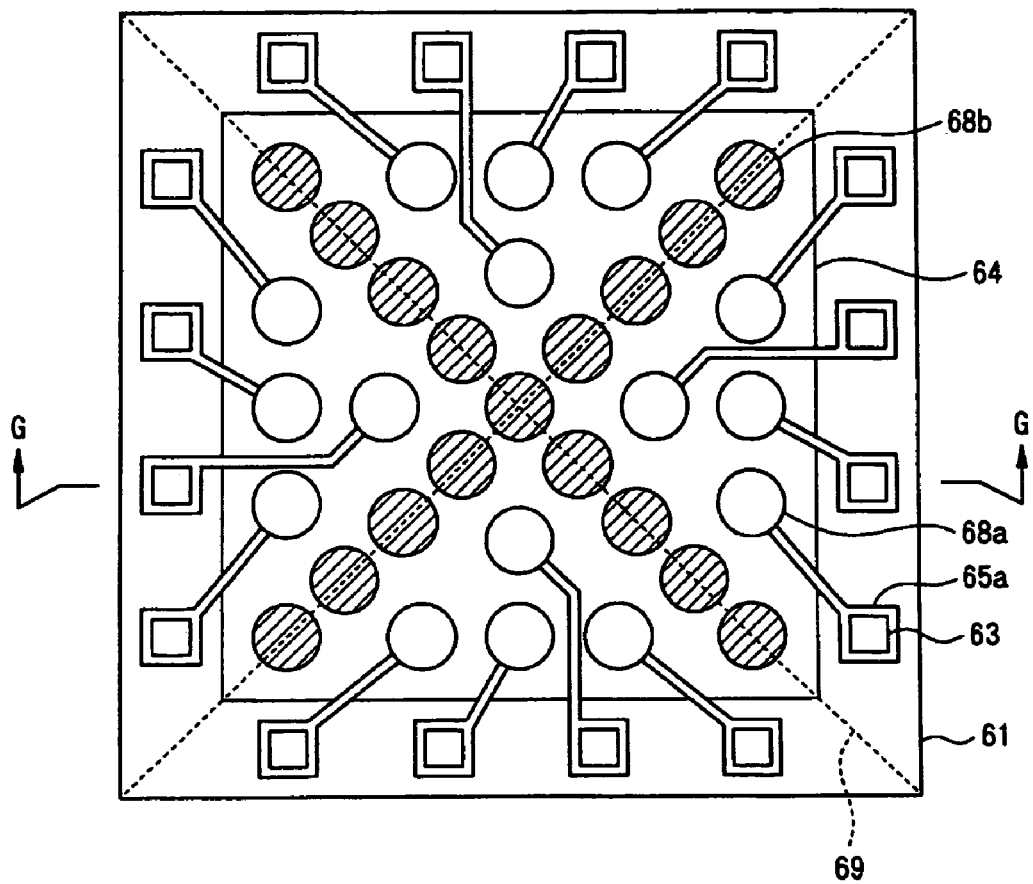
FIGS. 8a and 8b are views illustrating the structure of a chip size package in accordance with an eighth embodiment of the present invention.
Figure 8:
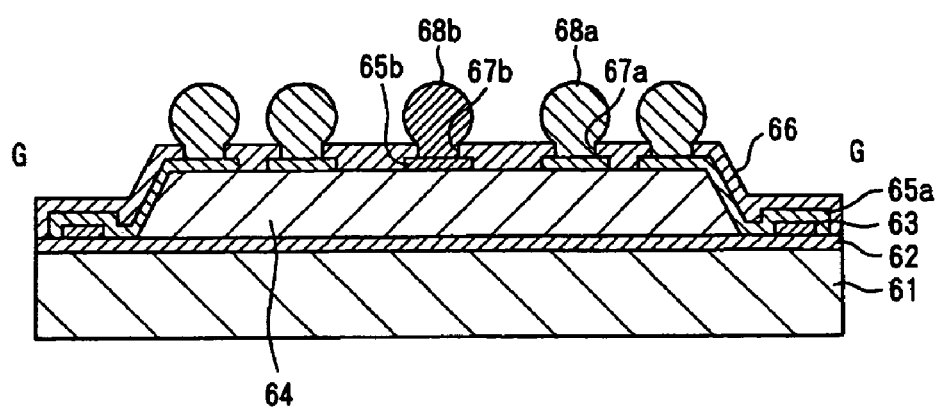

FIG. 8 (*a*) schematically shows a plan view of the structure of a chip size package in accordance with an eighth embodiment of the present invention, and FIG. 7 (*b*) shows a cross-sectional view taken along lines G—G of FIG. 8 (*a*).

Referring to FIG. 8, a wiring layer 62 connected to an active region is formed on a semiconductor chip 61, and pad electrodes 63 are formed on the wiring layer 62. Also, a stress buffer layer 64 is formed on the active region that is formed on the semiconductor chip 61 in a manner to expose the pad electrodes 63. Dummy lands 65*b* having dummy balls 68*b* disposed thereon are provided on the stress buffer layer 64, and rearrangement wirings 65*a* extending over the stress buffer layer 64 are formed on the pad electrodes 63. Here, the rearrangement wiring 65*a* and the dummy lands 65*b* can be composed of, for example, a three-layer structure including a TiW-sputtered wiring layer, a Cu-sputtered wiring layer and a Cu-plated wiring layer. Also, as a protection layer, for example, a solder resist film 66 is formed on the rearrangement wirings 65*a* and the dummy lands 65*b*, and opening sections 67*a* and 67*b* that expose the rearrangement wirings 65*a* and the dummy lands 65*b*, respectively, over the stress buffer layer 64 are formed in the solder resist film 66.

Furthermore, as bump electrodes and dummy bumps, for example, solder balls 68*a* and dummy balls 68*b* are disposed on the stress buffer layer 64. The solder balls 68*a* are connected to the rearrangement wirings 65 via the opening sections 67*a* formed in the solder resist film 66, and the dummy balls 68b are disposed on the dummy lands 65b through the opening sections 67b formed in the solder resist film 66.

Here, the solder balls 68a are disposed in a manner to avoid diagonal lines 69 of the semiconductor chip 61, and the dummy balls 68b are disposed at predetermined intervals on the diagonal lines 69 of the semiconductor chip 61. As a result, the solder balls 68a are prevented from being disposed on the diagonal lines 69 where large stresses are generated, and the connection state of the solder balls 68a can be reinforced by the dummy balls 68b.

For this reason, even when the size of the semiconductor chip 61 is large, stresses that work on the semiconductor chip 61 can be lowered, and poor connections of the solder balls 68a can be reduced, and the reliability in the secondary mounting can be readily improved.

It is noted that the solder balls 68a and the dummy balls 68b may be made of the same material and in the same size and shape. However, it should be understood that the solder balls 68a and the dummy balls 68b may be made of different material and in different sizes and shapes.

Figure 9:
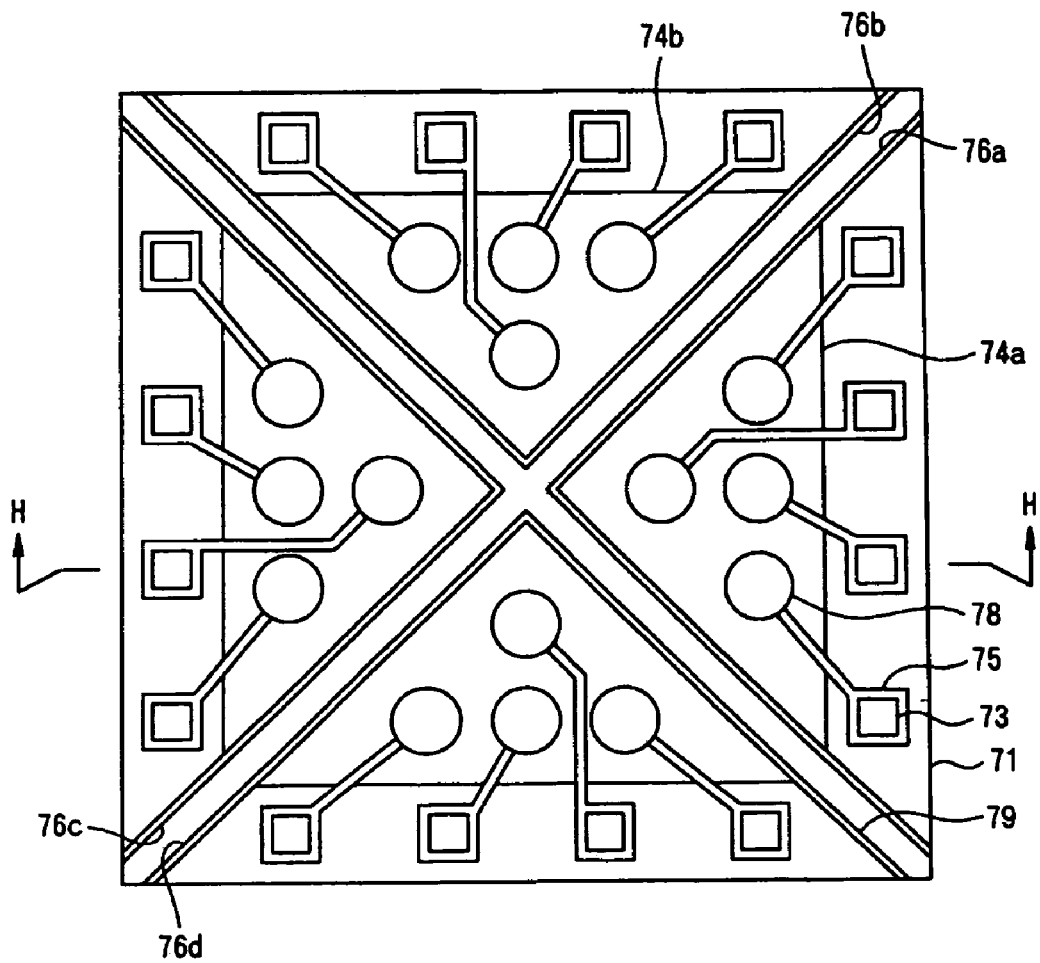
FIGS. 9a and 9b are views illustrating the structure of a chip size package in accordance with a ninth embodiment of the present invention.
Figure 9:
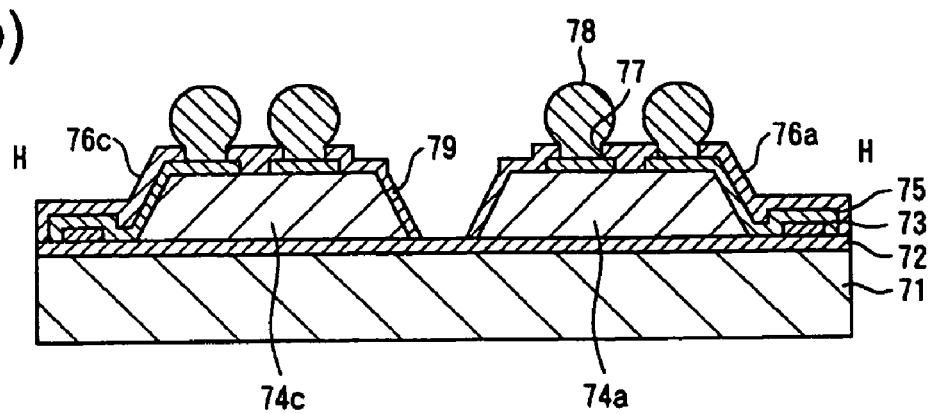

FIG. 9 (a) schematically shows a plan view of the structure of a chip size package in accordance with a ninth embodiment of the present invention, and FIG. 9 (b) shows a cross-sectional view taken along lines H—H of FIG. 9 (a).

Referring to FIG. 9, a wiring layer 72 connected to an active region is formed on a semiconductor chip 71, and pad electrodes 73 are formed on the wiring layer 72.

Further, stress buffer layers 74a–74b formed in a manner to expose the pad electrodes 73 are divided and disposed on an active region of the semiconductor chip 71, and rearrangement wirings 75 that extend over the stress buffer layers 74a–74b are formed on the pad electrodes 73.

Here, the rearrangement wiring 75 can be composed of, for example, a three-layer structure including a TiW-sputtered wiring layer, a Cu-sputtered wiring layer and a Cu-plated wiring layer.

Also, solder resist films 76a–76d that are divided and disposed at places corresponding to the respective stress buffer layers 74a–74d are formed on the rearrangement wirings 75 and the pad electrodes 73. Opening sections 77 that expose the rearrangement wirings 75 over the respective stress buffer layers 74a–74d are formed in the solder resist films 76a–76d.

As bump electrodes, for example, solder balls 78 are formed on the respective stress buffer layers 74a–74d, and the respective solder balls 78 are connected to the rearrangement wirings 75 via the opening sections 77 formed in the respective solder resist films 76a–76d.

Here, the solder balls 78 are disposed in a manner to avoid diagonal lines of the semiconductor chip 71, and the stress buffer layers 74a–74d and the solder resist films 76a–76d are divided along the diagonal lines of the semiconductor chip 71.

By this, stresses that work on the semiconductor chip 71 can be segmented, thereby lowering the stresses that work on the semiconductor chip 71. Therefore warps of the semiconductor chip 71 can be reduced, and the reliability in the secondary mounting can be improved even when the size of the semiconductor chip 71 is large.

FIGS. 10a–e are cross-sectional views illustrating a method for manufacturing a chip size package in accordance with a tenth embodiment of the present invention.

Figure 10:
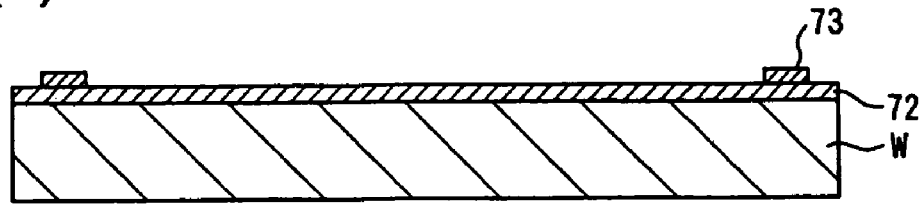
FIGS. 10a–10e are views illustrating a method for manufacturing a chip size package in accordance with a tenth embodiment of the present invention.
Figure 10:
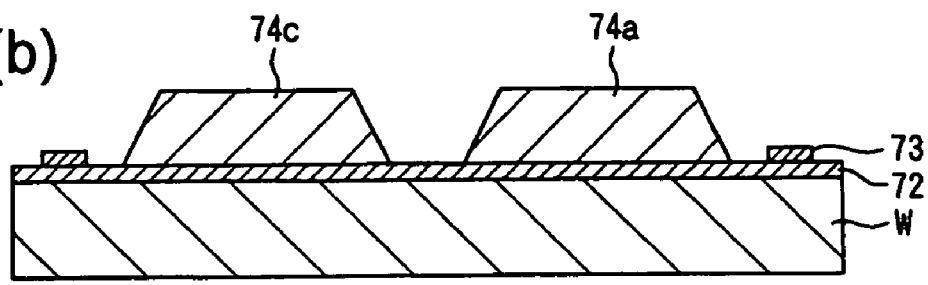
Figure 10:
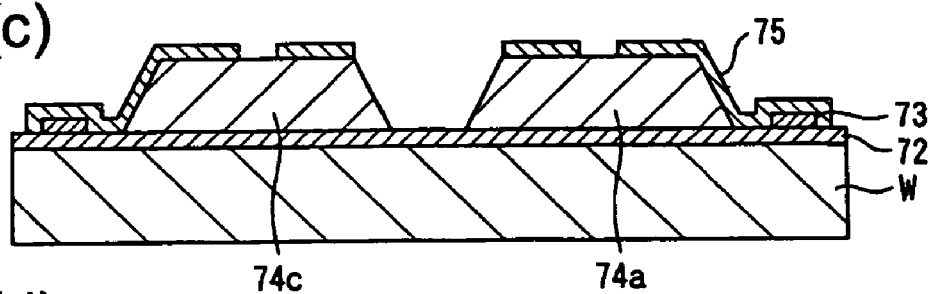
Figure 10:
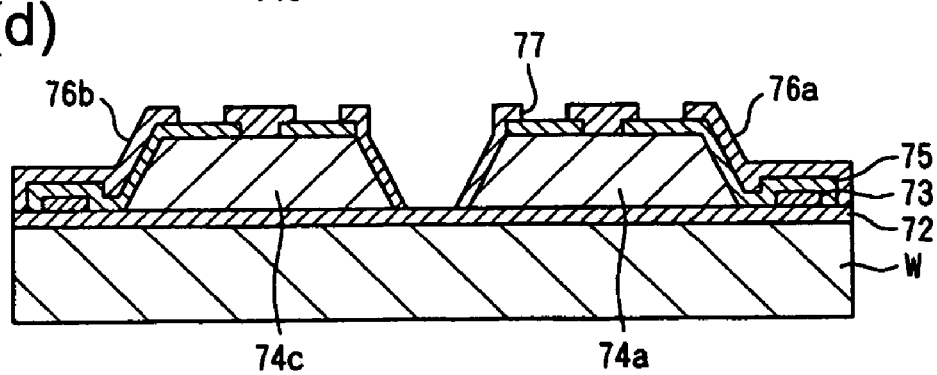
Figure 10:
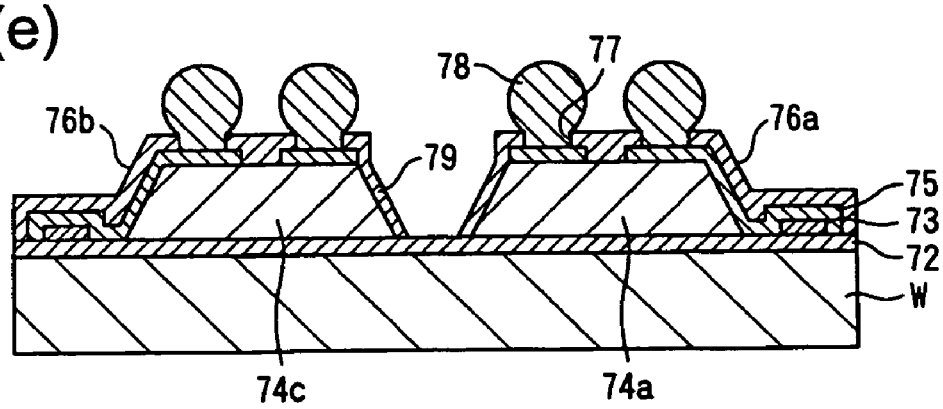

As shown in FIG. 10 (a), a wiring layer 72 having pad electrodes 73 provided thereon is formed on a semiconductor wafer W.

Then, as shown in FIG. 10 (b), a resin film such as polyimide film is coated on the semiconductor wafer W where the wiring layer 72 and the pad electrodes 73 are formed, and the resin film is patterned by using photolithography technique to thereby expose the pad electrodes 73, and form stress buffer layers 74a–74d on the wiring layer 72, which are divided along the diagonal lines.

Next, as shown in FIG. 10 (c), over the semiconductor wafer W having the stress buffer layers 74a–74d formed thereon, a TiW-sputtered film and a Cu-sputtered film are successively deposited in layers by sputtering, and then a plating resist film is coated.

Then, by using photolithography technique, opening sections corresponding to rearrangement wirings 75 can be formed in the plated resist film, and Cu-plated wiring layers are formed through the opening sections by conducting electrolytic copper plating.

Then, the plated resist film is removed, and the Cu-sputtered film and the TiW-sputtered film are successively etched using the Cu-plated wiring layers as masks, to thereby form Cu-sputtered wiring layers and TiW-sputtered wiring layers, thereby completing the rearrangement wirings 75.

Next, as shown in FIG. 10 (d), solder resist is coated on the rearrangement wirings 75, and by using photolithography technique, solder resist films 76a–76d that are divided and disposed along the diagonal lines are formed on the rearrangement wirings 75, and opening sections 77 that expose the rearrangement wirings 75 are formed in the solder resist films 76a–76d.

Then, as shown in FIG. 10 (e), solder balls 78 that are connected via the opening sections 77 to the rearrangement wirings 75 are formed on the solder resist films 76a–76d. Reinforcing resin is coated over the entire surface depending on the necessity, and then the solder balls 78 are exposed by sputtering to thereby reinforce base sections of the solder balls 78.

By this, when the stress buffer layers 74a–74d and the solder resist films 76a–76d are patterned, the stress buffer layers 74a–74d and the solder resist films 76a–76d can be divided, and thus stresses that work on the semiconductor chip 71 can be segmented without increasing the number of manufacturing steps.

Figure 11:
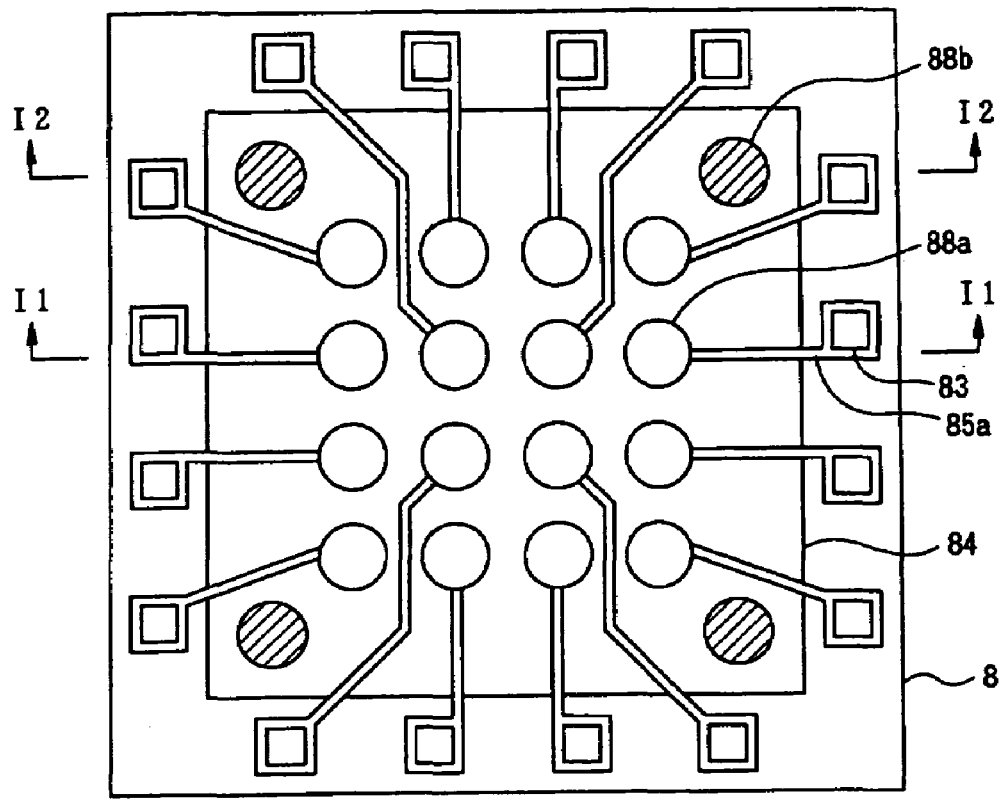
FIGS. 11a–11c are views illustrating the structure of a chip size package in accordance with an eleventh embodiment of the present invention.
Figure 11:
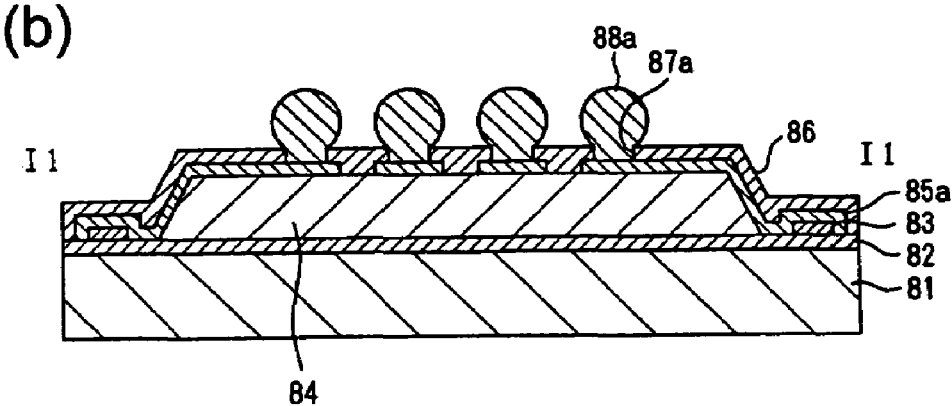
Figure 11:
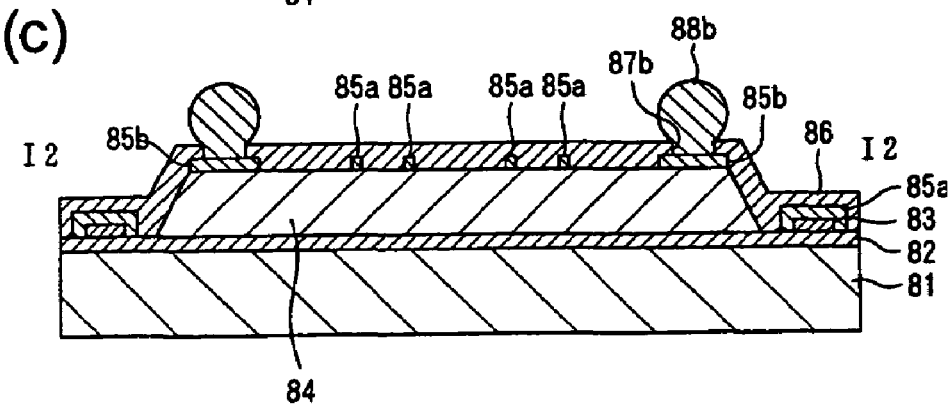

FIG. 11 (a) schematically shows a plan view of the structure of a chip size package in accordance with an eleventh embodiment of the present invention, FIG. 11 (b) shows a cross-sectional view taken along lines I1—I1 of FIG. 11 (a), and FIG. 11 (c) shows a cross-sectional view taken along lines I2—I2 of FIG. 11 (a).

Referring to FIG. 11, a wiring layer 82 connected to an active region is formed on a semiconductor chip 81, and pad electrodes 83 are formed on the wiring layer 82.

Also, a stress buffer layer 84 is formed on the active region that is formed on the semiconductor chip 81 in a manner to expose the pad electrodes 83. Dummy lands 85b having dummy balls 88a disposed thereon are provided in the four corners on the stress buffer layer 84, and rearrangement wirings 85a that extend over the stress buffer layer 84 are formed on the pad electrodes 83.

Here, the rearrangement wirings 85a and the dummy lands 85b can be composed of, for example, a three-layer structure including a TiW-sputtered wiring layer, a Cu-sputtered wiring layer and a Cu-plated wiring layer. Also, a solder resist film 86 is formed on the rearrangement wirings 85a and the dummy lands 85b, and opening sections 87a and 87b, which expose the rearrangement wirings 85a and the dummy lands 85*b* respectively over the stress buffer layer 84, are formed in the solder resist film 86.

Further, dummy balls 88*b* are formed on the stress buffer layer 84 in a manner to be disposed in the four corners of the stress buffer layer 84, and the dummy balls 88*b* are disposed on the dummy lands 85*b* via the opening sections 87*b* that are formed in the solder resist film 86.

Further, solder balls 88*a* are disposed inside the dummy balls 88*b*, and the solder balls 88*a* are connected to the rearrangement wirings 85*a* via the opening sections 87*a* formed in the solder resist film 86.

As a result, the solder balls 88*a* are prevented from being disposed in the four corners on the outermost circumference of the stress buffer layer 84. As the semiconductor chip 81 having the solder balls 88*a* formed thereon is mounted on a mother substrate, the connection state of the solder balls 88*a* can be reinforce by the dummy balls 88*b*.

For this reason, even when the chip size package becomes large, poor connections of the solder balls 88*a* can be reduced without increasing the number of manufacturing steps, a reduction in the throughput can be suppressed, and the reliability in the secondary mounting of the chip size package can be improved.

It is noted that the package structure described above is applicable to electronic devices, such as, for example, liquid crystal display devices, portable telephones, portable information terminals, video cameras, digital cameras, MD (Mini Disc) players and the like. By using the package structure described above, the electronic devices can be made smaller and lighter, and the reliability of the electronic devices can be improved.

What is claimed is:

1. A wiring substrate, comprising:
a wiring layer formed on a substrate; and
terminal electrodes that are coupled to the wiring layer and disposed on the substrate in a manner to avoid diagonal lines thereof.

2. A wiring substrate, comprising:
a wiring layer formed on a substrate;
terminal electrodes that are coupled to the wiring layer and disposed on the substrate; and
stress insulation sections provided along diagonal lines of the substrate.

3. The wiring substrate according to claim 2, the stress insulation sections being at least one of grooves and slits.

4. A wiring substrate, comprising:
a wiring layer formed on a substrate;
terminal electrodes that are coupled to the wiring layer and disposed on the substrate; and
dummy terminals that are provided in four corners or on diagonal lines of the substrate.

5. A semiconductor device, comprising:
a semiconductor chip having an active region and pad electrodes formed thereon;
a stress buffer layer formed on the active region;
bump electrodes that are formed on the stress buffer layer and disposed based on a stress distribution that works on the semiconductor chip;
rearrangement wiring layers that couple the bump electrodes and the pad electrodes; and
a protection layer that is formed over the rearrangement wiring layers and the pad electrodes.

6. A semiconductor device, comprising:
a semiconductor chip having an active region and pad electrodes formed thereon;
a stress buffer layer formed on the active region;
bump electrodes that are formed on the stress buffer layer and disposed in a manner to avoid diagonal lines thereof;
rearrangement wiring layers that couple the bump electrodes and the pad electrodes; and
a protection layer that is formed over the rearrangement wiring layers and the pad electrodes.

7. A semiconductor device, comprising:
a semiconductor chip having an active region and pad electrodes formed thereon;
stress buffer layers that are formed on the active region, and divided and disposed along diagonal lines;
bump electrodes formed on the stress buffer layers;
rearrangement wiring layers that couple the bump electrodes and the pad electrodes; and
protection layers that are formed over the rearrangement wiring layers and the pad electrodes, and divided and disposed along the diagonal lines.

8. A semiconductor device, comprising:
a semiconductor chip having an active region and pad electrodes formed thereon;
a stress buffer layer that is formed on the active region;
bump electrodes formed on the stress buffer layer;
dummy bumps provided in four corners or on diagonal lines of the stress buffer layer;
rearrangement wiring layers that couple the bump electrodes and the pad electrodes; and
a protection layer that is formed over the rearrangement wiring layers and the pad electrodes.

9. A semiconductor module, comprising:
an interposer substrate having a semiconductor chip surface-mounted thereon;
a wiring layer provided on a back surface of the interposer substrate;
bump electrodes that are coupled to the wiring layer and disposed based on a stress distribution that works on the interposer substrate; and
through hole wirings that are provided in the interposer substrate and couple the semiconductor chip and the wiring layer.

10. A semiconductor module, comprising:
an interposer substrate having a semiconductor chip surface-mounted thereon;
a wiring layer provided on a back surface of the interposer substrate;
bump electrodes that are coupled to the wiring layer and disposed on the back surface of the interposer substrate in a manner to avoid diagonal lines; and
through hole wirings that are provided in the interposer substrate and couple the semiconductor chip and the wiring layer.

11. A semiconductor module, comprising:
an interposer substrate having a semiconductor chip surface-mounted thereon;
a wiring layer provided on a back surface of the interposer substrate;
bump electrodes that are coupled to the wiring layer and disposed on the back surface of the interposer substrate in a manner to avoid diagonal lines;
at least one of grooves and slits provided along diagonal lines of the interposer substrate; and
through hole wirings that are provided in the interposer substrate and couple the semiconductor chip and the wiring layer.

12. A semiconductor module, comprising:
an interposer substrate having a semiconductor chip surface-mounted thereon;

a wiring layer provided on a back surface of the interposer substrate;

bump electrodes that are coupled to the wiring layer and disposed on the back surface of the interposer substrate;

dummy bumps provided in four corners or on diagonal lines of the back surface of the interposer substrate; and through hole wirings that are provided in the interposer substrate and couple the semiconductor chip and the wiring layer.

13. An electronic device, comprising:

an interposer substrate having a semiconductor chip surface-mounted thereon;

a wiring layer provided on a back surface of the interposer substrate;

bump electrodes that are coupled to the wiring layer and disposed on the back surface of the interposer substrate in a manner to avoid diagonal lines;

through hole wirings that are provided in the interposer substrate and couple the semiconductor chip and the wiring layer;

a mother substrate having the interposer substrate mounted thereon; and an electronic component that is coupled to the bump electrodes through the mother substrate.

* * * * *